United States Patent [19]

Shreve et al.

[11] 3,995,263

[45] Nov. 30, 1976

[54] OSCILLOSCOPE DATE-TIME GENERATOR AND DISPLAY

[75] Inventors: James S. Shreve; George R. Thompson, both of Fairfax, Va.

[73] Assignee: The United States of America as represented by the Secretary of the Army, Washington, D.C.

[22] Filed: Dec. 5, 1974

[21] Appl. No.: 529,871

[52] U.S. Cl. ........................ 340/324 AD; 58/152 R
[51] Int. Cl.² ............................................ G06F 3/14
[58] Field of Search ......... 340/324 A, 324 AD, 336; 58/152 R, 50 R, 50 A, 23

[56] References Cited

UNITED STATES PATENTS

| | | | |
|---|---|---|---|
| 3,396,378 | 8/1968 | Keith, Jr. | 340/336 |
| 3,792,613 | 2/1974 | Couture | 340/324 AD |

OTHER PUBLICATIONS

Video Time and Date Generator ET202 Cramer Video; Rc'd. July 5, 1973; copy avail. A.U. 233.

*Primary Examiner*—Marshall M. Curtis
*Attorney, Agent, or Firm*—Nathan Edelberg; Robert P. Gibson; Saul Elbaum

[57] ABSTRACT

A device readily adaptable into existing laboratory oscilloscopes for causing the current date and time of day to be displayed on the screen thereof. In a preferred embodiment, the analog read out comprises ten digits across the top of the oscilloscope screen and respectively represent years, hundreds of days, tens of days, days, tens of hours, hours, tens of minutes, minutes, tens of seconds, and seconds. The device essentially comprises a time-keeping module for generating binary coded decimal signals representative of the date and time data, a slightly modified standard oscilloscope keyboard read out plug-in unit, and, of course, the oscilloscope itself. Initialization of the data may be accomplished by manually operable thumbwheel switches located on the time-keeping module. The device keeps time to an accuracy of about one-fifth second per day and is extremely useful when precise time recordation of remotely obtained data is necessary.

9 Claims, 3 Drawing Figures

OSCILLOSCOPE DATE-TIME GENERATOR AND DISPLAY

RIGHTS OF THE GOVERNMENT

The invention described herein may be manufactured, used, and licensed by or for the United States Government for governmental purposes without the payment to us of any royalty thereon.

BACKGROUND OF THE INVENTION

1. Field of the Invention

The present invention is related to oscilloscope display units and, more particularly, to a unit utilized to display the current data and time of day on the CRT screen of a standard laboratory oscilloscope.

2. Description of the Prior Art

Very frequently it is necessary to accurately record the actual time of occurrence of a particular laboratory event such as may be recorded on the face of an oscilloscope screen. For example, during the field testing of weapons systems and components, a series of photographs of oscilloscope traces are taken the time interval between which is extremely important in evaluating the results. Previously, the recordation of the time of a data recording event has been manual and threrefore subjected to human error and inaccuracies.

Accordingly, it would be extremely useful if a device could be adapted to existing laboratory oscilloscopes which would provide an instantaneous and accurate read out of the date and time such that upon the taking of an oscilloscope photograph the time and date would be accurately and permanently recorded thereon.

OBJECTS AND SUMMARY OF THE INVENTION

It is accordingly a primary object of the present invention to provide a device which simply and accurately produces the date and time of day on the CRT screen of a standard laboratory oscilloscope.

Another object of the present invention is to provide a reliable date and time of day generator which may be easily adapted into existing, off the shelf laboratory oscilloscopes with a minimum of modification.

An additional object of the present invention is to provide a device which enables a standard laboratory oscilloscope to continuously produce on the face thereof a series of digits representative of the date and time of day, down to seconds, such that the same may be permanently recorded upon any photograph of the oscilloscope trace.

A still further object of the present invention is to provide a device which generates in BCD form character information indicative of the date and time of day which may be converted to analog information for transfer to the face of a standard laboratory oscilloscope to be displayed thereon.

A still additional object of the present invention is to provide a portable and reliable date and time of day generating device which allows manual introduction of initializing data and further which requires very little modification to existing laboratory oscilloscopes for incorporation therewith.

Another object of the present invention is to provide a time keeping module which, when interconnected with a slightly modified standard laboratory oscilloscope, allows the current date and time of day to be visually output on the CRT screen thereof and which easily allows several of such time keeping units to be physically synchronized so as to provide synchronized timing information for a plurality of such oscilloscopes.

The foregoing and other objects are attained in accordance with one aspect of the present invention through the provision of an oscilloscope date-time generator which is connected to a standard laboratory oscilloscope which has a capability for displaying alpha-numeric characters on the screen thereof. The date-time generator generates a plurality of numbers continuously representative of the date and time of day in binary coded decimal form by means of a master 1MHz clock and a plurality of counters. The counter outputs are buffered and multiplexed according to strobe pulses and address information received from a standard character keyboard read out unit of the oscilloscope. Means are also provided, in accordance with another aspect of the present invention, for manually entering an initializing date and time such that several of the units may be synchronized for later simultaneous use. In a preferred embodiment, the date-time generator or module is utilized in connection with a Tektronix 7000 series oscilloscope and a slightly modified Tektronix model 7M13 read out unit.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF THE PREFERRED EMBODIMENT

Figure 1:
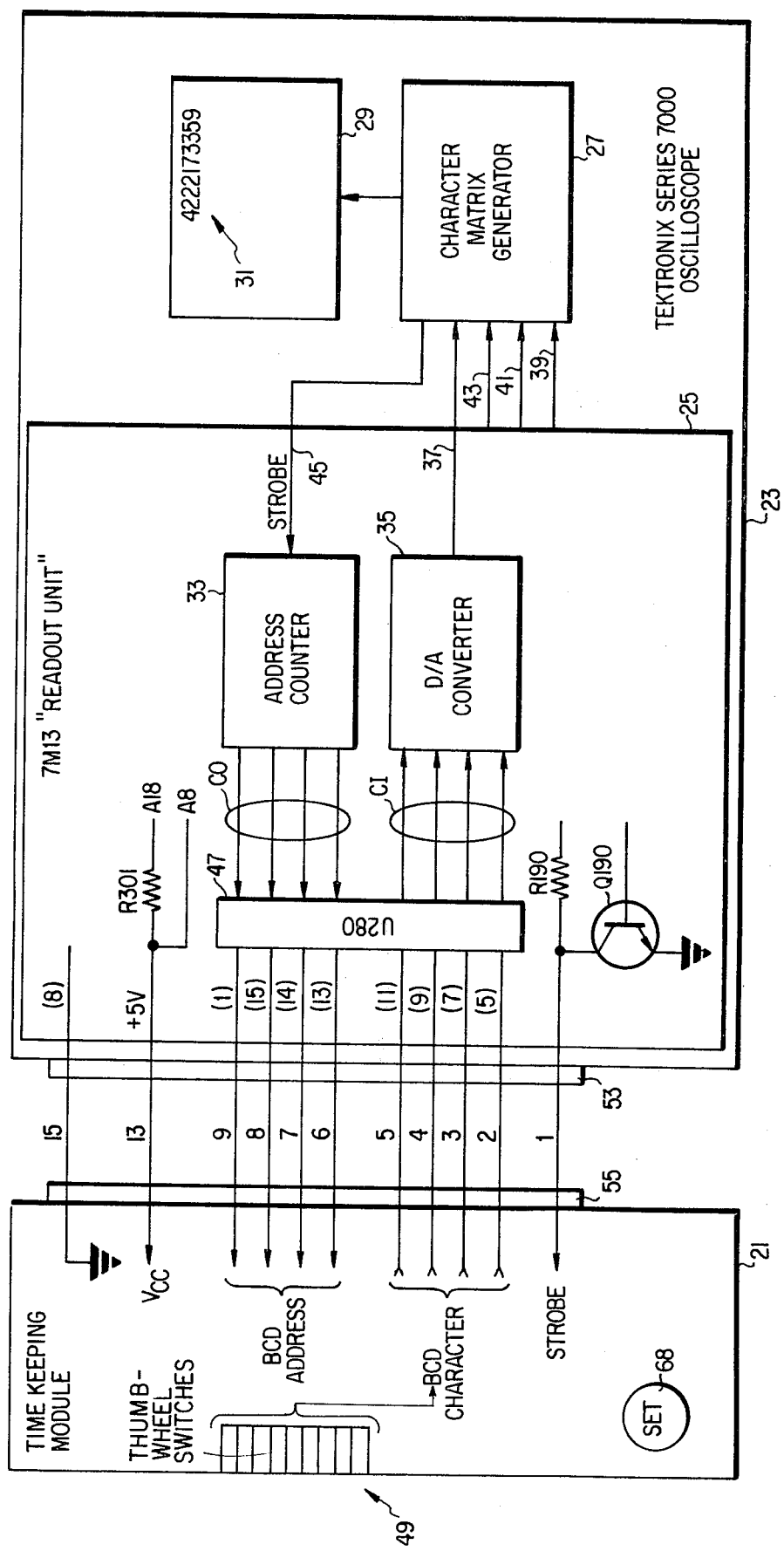
FIG. 1 is a block diagram of the overall system embodying a preferred embodiment of the oscilloscope date-time generator according to the present invention.

Referring now to FIG. 1, the preferred embodiment of the present invention includes a time keeping module 21 connected to a standard laboratory oscilloscope 23. Oscilloscope 23 may obviously comprise any standard, well-known laboratory oscilloscope capable of an alpha-numeric read out. However, for the purposes of clarity and conciseness, the present invention will be described in connection with the best mode contemplated for carrying out the present invention. Namely, oscilloscope 23 preferably comprises a Tektronix (trademark) series 7000 oscilloscope which includes a model 7M13 "read out unit" 25 as a plug-in, slightly modified in a manner to be described in more detail hereinafter.

Oscilloscope 23 also includes a character matrix generator 27 for receiving analog signals from read out unit 25 along lines 37, 39, 41 and 43, and a standard CRT oscilloscope screen 29.

Shown displayed in the upper right-hand corner of screen 29 is a ten-digit number, indicated by the reference numeral 31, which is schematically representative of the type of read out available with this particular instrument taken in connection with the present invention. Read out characters 31 are seen to include ten digits which respectively correspond, in accordance with the invention, with the following date and time of day information:

4: the year (1974);
2: hundreds of days;
2: tens of days;
2: days;
1: tens of hours;
7: hours;
3: tens of minutes;
3: minutes;
5: tens of seconds;
9: seconds.

Accordingly, the ten-digit number "4222173359" represents 59 seconds past 5:33 pm on the 222nd day of 1974.

Read out unit 25 is a front panel standard plug-in keyboard unit which displays 10 selected characters on the face of oscilloscope screen 29. Character matrix generator 27 generates 10 strobe pulses along line 45, one strobe pulse for each character position of the ten character word 31 to be displayed. Read out unit 25 includes a 4 bit address counter 33 responsive to the strobe pulses along line 45 for providing a BCD output in response thereto. Read out unit 25 also transmits from a plurality of digital-to-analog converters, such as D/A converter 35, four analog signals on lines 37, 39, 41 and 43 upon the receipt of the strobe pulses. The signal levels on two of the lines, for example lines 39 and 41, at the time of any given strobe pulse, select which character is to be displayed at the corresponding position in the word which appears at the bottom of the oscilloscope screen 29, while the signal levels on the remaining two lines, for example lines 37 and 43, select which character is to be displayed at the corresponding position in the word at the top of oscilloscope screen 29. Thus, the model 7M13 read out unit 25 has the capability of controlling the characters in two ten-character words, only one of which, namely word 31, need be utilized to display the current date and time of day according to the present invention.

The signal levels on the pair of lines, for example lines 37 and 43, are fed to the character matrix generator 27 for selecting from the matrix of available characters those desired to be displayed. One signal, for example the signal along line 43, selects the particular row of the matrix, while the other signal pair, for example the signal along line 37, selects the matrix column. In this preferred embodiment, inasmuch as the digits zero through nine occupy the first row of the matrix, only the column signal along line 37, for example, is necessary to select the desired digit. Which digit within the column is determined by the level of the signal along line 37. For example, the digit 0 is selected by a signal level along line 37 of 0.1 ma.; the digit 1 is selected by a signal level of 0.2 ma.; etc.; and the digit 9 is selected by a signal level along line 37 of 1.0 ma. Read out unit 25 contains a plurality of specially made digital-to-analog converters, such as d/a converter 35, which supplies such levels according to a bit-complemented BCD input. Such a BCD bit-complemented input is provided by time keeping module 21 in a manner to be described in more detail hereinafter.

Certain minor modifications need be made to an off the shelf model 7M13 read out unit, such as read out unit 25, in accordance with the present invention. In order to utilize the upper-word column signal to produce word 31 on screen 29, access to d/a converter 35 may be gained by removing chip number U 280 from the model 7M13 and inserting a microcircuit board 47 in the empty socket. Circuit board 47 provides access to the input CI of d/a converter 35, and also to the output lines CO of address counter 33. Address counter 33, as explained hereinabove, comprises a 4-bit counter responsive to the strobe pulse along line 45 for determining where in the 10-character word the present character is to be displayed. Thus, the output of address counter 33 along line CO comprises the "address" of the character.

Microcircuit board 47 is shown schematically as an interface between the two 4-bit BCD numbers respectively being fed to and away from converter 35 and counter 33. To the immediate left of board 47 in FIG. 1 are shown in parentheses the numbers of the pin connections which must be made to the U 280 socket after removing the chip from the standard model 7M13 unit.

A panel connector 53 may be provided on the face of read out unit 25 to accept the interconnecting cable to the time keeping module 21. Those cable line numbers appearing intermediate units 23 and 21 correspond to like cable lines identified below with respect to FIG. 2. That is, lines 2 through 5 correspond to the BCD character input to d/a converter 35, while lines 6 through 9 correspond to the output of address counter 33. Line 1 provides a strobe signal for the first character which is taken from the collector of transistor Q190 of read out unit 25. Further, line 13 provides a 5 volt power tap from resistor R301, while line 15 provides a ground connection. Thus, cable lines 1 through 9, 13 and 15 are fed into a similar connector 55 in time keeping module 21.

Time keeping module 21 is provided with a plurality of thumb wheel switches 49. Thumb wheel switches 49 provide a BCD output, to be explained in more detail hereinafter, and enable a manual date and time to be entered for purposes of accurate initiation and synchronization. Thumb wheel switches 49 may, for example, comprise the series T-60 units as manufactured by the Cherry Electrical Products Corporation of Waukegan, Illinois. A set switch 51 is also provided which, when activated, "dumps" the preset information in switches 49 into the counters of the time keeping module 21, in a manner to be explained in more detail hereinafter.

Figure 2A:
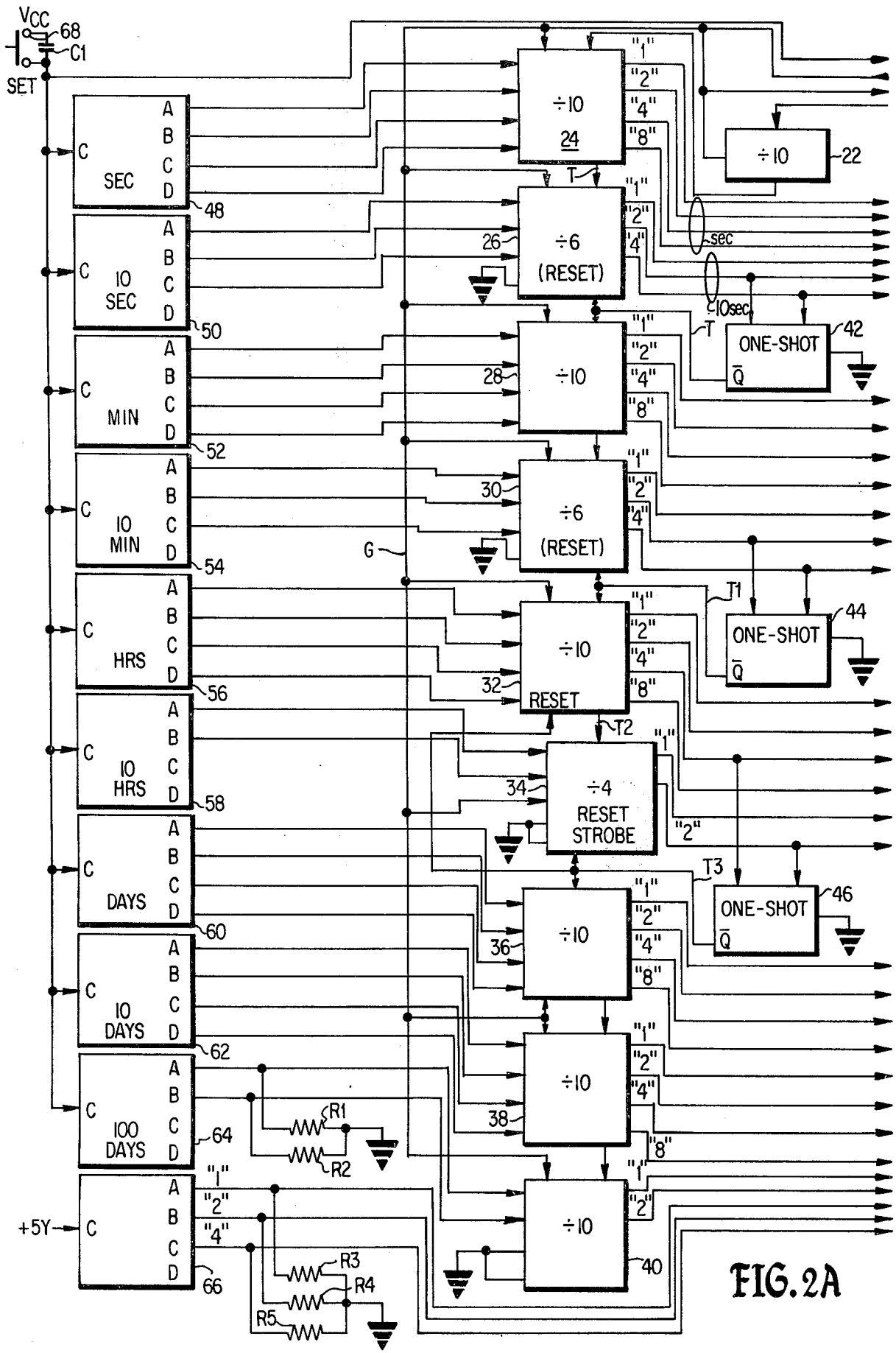
FIGS. 2a and 2b are a detailed schematic diagram illustrative of the time-keeping module utilized in conjunction with the preferred embodiment illustrated in FIG. 1.
Figure 2B:
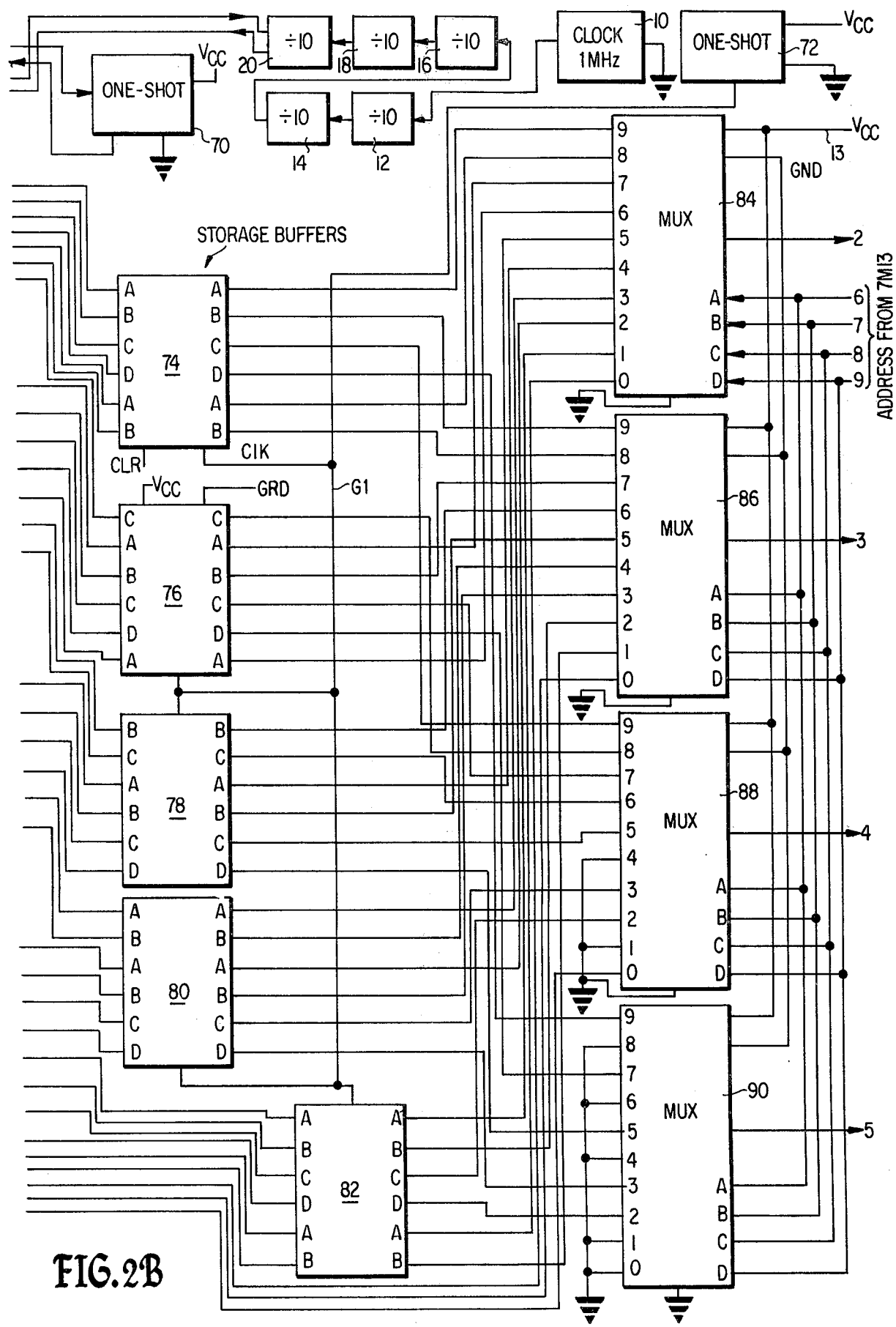

Referring now to FIG. 2, the time keeping module 21 of the present invention is shown in schematic detail. The circuitry in FIG. 2 performs the functions of setting and keeping time, buffering the read out signals, and multiplexing the read out signals. At the heart of the system is a temperature compensated 1.0 MHz. crystal oscillator or clock 10. Clock 10 may comprise, for example, the model 252-1861 as manufactured by Vectron of Norwalk, Connecticut, which has a stability of ± 1 part per million over a temperature range of −20° C. to +70° C. The clock includes a screwdriver adjustment for resetting the frequency as the clock ages, although aging introduces less than 1 part per million error per year.

Clock 10 is continuous running and is fed by a +12 volt source of supply which, for example, may be provided by a battery. Clock 10 drives a series of counters 12, 14, 16, 18, 20, 22, 24, 26, 28, 30, 32, 34, 36, 38 and 40, which may, for example, be comprised of the model 8292 decade counters manufactured by the Signetics Corporation of Sunneyvale, California. Counters 12 through 22 are each connected in a divide-by-ten configuration such that the output from counter 22 is at the frequency of 1 pulse per second. Counters 24, 28, 32, 36, 38 and 40 are also connected in a divide-by-ten configuration, while counters 26 and 30 with the aid of one shot circuits 42 and 44 are connected in a divide-by-six configuration, and counter 34 with the aid of one shot circuit 46 is connected in a divide-by-four configuration.

In operation, each of the counters 24 through 40 has a 2, 3 or 4-bit output as dictated by the maximum value required from each counter. For example, the output from counter 24, designated by the sec line group, comprises a 4-bit output which resets every 10 seconds. Thus, the triggering output T from counter 24 to counter 26 is at the rate of 1 pulse every 10 seconds. Counter 26 is connected in a divide-by-six configuration with the aid of one shot circuit 42 whose inputs are ANDED to the 2 and 4 outputs of counter 26. In this manner, one shot circuit 42 delivers an output pulse along line T to reset counter 26 and to trigger counter 28 once every 60 seconds, or once per minute. Since counter 26 must only count to six, it only requires a 3-bit output as designated by line group 10 sec.

Counter 28 is therefore triggered once every minute by the output pulse from one-shot 42. Counter 28 is connected in a divide-by-ten configuration which resets and delivers a trigger pulse to counter 30 once every 10 minutes. Counter 30, like counter 26, is connected in a divide-by-six configuration by means of one shot circuit 44 which delivers a trigger pulse to counter 32 and resets counter 30 once every 60 minutes, or once every hour. This is achieved by ANDING the 2 and 4 outputs from counter 30 to one shot 44 and providing an output pulse along line T1 to the reset input of counter 30 and the trigger input of counter 32.

Counter 32 is connected in a divide-by-ten configuration to deliver a reset pulse to counter 34 once every 10 hours along line T2. Counter 34 cooperates with one shot circuit 46 and counter 32 to trigger counter 36 once each day, or with a pulse every 24 hours. This is achieved by connecting the AND inputs of one shot 46 to respectively the 4 bit output of counter 32 which is pulsed once every 4 hours, and to the 2 bit output of counter 34 which is pulsed once every 20 hours, such that the output from one shot 46 along line T3 appears once every 24 hours. This output along line T3 resets counters 32, 34 and 36.

Counter 36 is connected in a divide-by-ten configuration to deliver a reset pulse to counter 38 once every 10 days. Similarly, counter 38 is connected in a divide-by-ten configuration to deliver a reset pulse to counter 40 once every 100 days. For the sake of economy, years are not counted but are set manually by the operator in a manner to be described in more detail hereinafter.

In summary, the 4-bit output from counter 24 indicates seconds, the 3-bit output from counter 26 indicates tens of seconds, the 4-bit output from counter 28 indicates minutes, the 3-bit output from counter 30 indicates tens of minutes, the 4-bit output from counter 32 indicates hours, the 2-bit output from counter 34 indicates tens of hours, the 4-bit output from counter 36 indicates days, the 4-bit output from counter 38 indicates tens of days, and the 2-bit output from counter 40 indicates hundreds of days.

Each of the counters 24 through 40 has a preset capability such that any desired reading may be manually entered. This may be accomplished, for example, by means of a plurality of thumb wheel switches 48 through 64 which deliver a binary-coded-decimal output to respective inputs of the associated counter. A set switch 68 on the front panel of the time keeping module 21 (see FIG. 1) connects a positive source of potential to each of the thumb wheel switches 48 through 64. The activation of switch 68 also feeds power to activate a one shot circuit 70 to gate in the outputs from thumb wheel switches 48 through 64 via line G to counters 24 through 40, respectively. When set switch 68 is released, power is removed from the switches to prolong battery life. A capacitor C1 is included so as to minimize switch bounce. Shown in connection with the output bits of counter 64 are a pair of resistors R1 and R2 which are pulldown resistors. Although not specifically shown, such resistors are placed between all used bit outputs of switches 48 through 62 to ground, a technique well known in the art.

A manually operable thumb wheel switch 66 is also provided for entering the year. As previously noted, years are not counted, but are manually set by the operator. In the preferred embodiment, a single digit up to the numeral 7 may be input as the year, although obviously extensions may be made such that a full decade of years may be input. Pull-down resiistors R3, R4 and R5 are also provided to the used bit outputs of switch 66.

The output from counters 24 through 40 are fed to a series of storage buffers 74, 76, 78, 80, and 82 each of which are comprised of six D-type flip flops. To accommodate the 30 bit outputs from counters 24 through 40, five such buffers are required, some of the bit outputs from various counters being shared between different buffers. The data present at the inputs of each storage buffer is transferred to the output thereof only upon the receipt of a clock pulse. The clock pulse is provided by means of a one shot circuit 72 along line G1. One shot 72 is, in turn, triggered by the strobe pulse received along line 1 of the connecting cable between the time keeping module 21 and the read out unit 25 (see FIG. 1). For normal data acquisition, strobe pulse 1 will be provided at a frequency corresponding to the data being recorded on the oscilloscope. Thus, storage buffers 74 through 82 operate so as to freeze the output status of the buffers when a read out is desired so as to avoid transitions during such read out periods.

The output data from the storage buffers, once triggered by the strobe from one shot 72, are fed to a series of addressable multiplexer units 84, 86, 88 and 90 which may, for example, comprise model SN54150N as manufactured by Texas Instruments. Multiplexers 84 through 90 each receive a 4-bit address along lines 6, 7, 8, and 9 from the model 7M13 read out unit 25 (see FIG. 1). The address is produced by address counter 33 is response to a strobe from the character matrix generator of the oscilloscope 23. The address sequences the multiplexer units 84 through 90 so as to successively read out the ten digits of information as stored in storage buffers 74 through 82 and as manually read in from thumb wheel switch 66. The output from multiplexers 84, 86, 88 and 90 are BCD numerals fed along lines 2, 3, 4 and 5, respectively, which collectively define a BCD word indicative of the particular digit of information according to the address received along lines 6, 7, 8 and 9. In other words, when the address from the read out unit 25 received along lines 6, 7, 8 and 9 is 0000, each multiplexer will address its 0 input which, in this instance, corresponds to the BCD year from thumb wheel switch 66. The reading according to switch 66 will then be output as a BCD numeral along lines 2, 3 and 4. Note that in this case, the 0 input to multiplexer 90 is grounded since there is only a 3-bit output from switch 66, and thus there will be no output along line 5, of multiplexer 90.

In the foregoing manner, each multiplexer 84 through 90 is sequentially addressed so as to read out the BCD data along lines 2 through 5 corresponding to the ten words of information as counted by counters 24 through 40 and stored by storage buffers 74 through 82 and thumb wheel switch 66. As explained in more detail in connection with FIG. 1, the output along lines 2, 3, 4 and 5 is then fed to a digital-to-analog converter, the output of which is fed to the character matrix generator of the oscilloscope for addressing the proper digit to be displayed on the screen.

By way of example, one shot circuits 42, 44 and 46 may comprise Texas Instrument model No. 54122, while one shot circuits 70 and 72 comprise Texas Instruments model No. 54123. It is also understood by one skilled in the art that the external electrical components necessary to determine the pulse width from the one shot circuits has been omitted for the sake of brevity, although many acceptable configurations exist and will be apparent to an ordinarily skilled technician.

In a preferred form, the time keeping module 21 is battery powered and self contained in a portable unit so as to permit several of such units to be physically brought together for the purposes of synchronization. Obviously, all the components described in connection with the time keeping module may be housed in a single plug-in chassis configured similar to the model 7M13 as manufactured by Tektronix. We have found that when photographing transients on the screen of the oscilloscope, the oscilloscope should preferably be set up to read out on retrace, which may be accomplished by throwing a switch on the read out board beneath the right side cover of the Tektronix 7000-series oscilloscopes, as is well known in the art.

Obviously, numerous modifications and variations of the present invention are possible in light of the above teachings. For example, the date and time of day may be displayed at the bottom of the oscilloscope screen. To accomplish this within the context of the preferred embodiment components described above, chip number U 260 of the model 7M13 read out unit, instead of chip U 280, is removed to accept the circuit board 47. Further, it should be apparent that the system of the present invention may work without buffers. Since the oscilloscope requires only approximately 2.5 milliseconds to display all 10 digits of the read out, operation without buffers may lead to erroneous results if the state of the counters changes in the middle of a read out. This occurs about once in 400 read outs, since the counters change once per second. The presence of the storage buffers preclude such an error, but obviously many compromise circuits may be proposed to achieve the same or like results. For example, one compromise circuit may exclude the buffers for days, tens of days, and hundreds of days, since read out transitions are unlikely.

In view of the foregoing, it is to be understood that within the scope of the appended claims, the invention may be practiced otherwise than as specifically described herein.

What is claimed as new and desired to be secured by letters patent of the United States is:

1. An oscilloscope date-time generator and display, which comprises;
   a cathode ray tube oscilloscope;
   a screen for displaying the analog output of said oscilloscope;
   a date and time generator means for continuously generating binary coded decimal (BCD) signals representative of instantaneous date and time, wherein said date and time generator means comprises a clock pulse generator, counter means connected to receive the output from said clock pulse generator for producing BCD outputs representative of said instanteous date and time, storage buffer means connected to receive said BCD outputs and output same upon receipt of a strobe pulse, and a multiplexer means which receive the output from said buffer means and produce a BCD output in response to an address command signal received from an address counter means which, itself, is responsive to said strobe pulse; and
   means connected to said oscilloscope for displaying alpha-numeric characters on said screen which includes means for generating said strobe pulse every time a character is to be displayed on said screen and means responsive to said BCD date and time signals for causing said alpha-numeric character displaying means to display a plurality of characters on said screen indicative of said instantaneous date and time independently of said analog output.

2. The combination according to claim 1, wherein said alpha-numeric character displaying means includes character matrix generator means for causing particular alpha-numeric characters to be displayed in response to the receipt thereby of respective predetermined analog signal amplitudes, and wherein said means responsive to said BCD date and time signals includes means for providing said analog signals in response to said BCD signals representative of said instantaneous date and time.

3. The combination according to claim 2, wherein said means for providing said analog signals comprises a digital-to-analog converter connected to receive said BCD signals from said date and time generator means.

4. The combination according to claim 3 wherein said address counter means responsive to said strobe pulse produces successive BCD address command signal outputs to said multiplexer means equal in number to the number of characters representative of said date and time to be displayed by said displaying means.

5. The combination according to claim 4 wherein said date and time generator means further comprises means for manually entering BCD signals into said counter means representative of desired date and time information.

6. The combination according to claim 5, wherein said means for manually entering BCD signals comprises a plurality of thumbwheel switches which provide a BCD output according to their respective analog settings.

7. The combination according to claim 6 wherein the number of said plurality of switches is at least ten for respectively registering ten characters of information corresponding to the year, hundreds of days, tens of days, days, tens of hours, hours, tens of minutes, minutes, tens of seconds, and seconds.

8. The compination according to claim 4 wherein said BCD output of said multiplexer means is connected to said digital-to-analog converter.

9. The combination according to claim 1 wherein said date and time generator means includes self-contained power supply means for causing same to be continuously operable to generate said BCD date and time signals whereby said date and time generator means is rendered portable.

* * * * *